United States Patent
Aniket et al.

(10) Patent No.: US 10,428,639 B2
(45) Date of Patent: Oct. 1, 2019

(54) DETERMINING DAMAGE TO A CASING STRING IN A WELLBORE

(71) Applicant: Landmark Graphics Corporation, Houston, TX (US)

(72) Inventors: Aniket, Houston, TX (US); Adolfo Gonzales, Houston, TX (US); Robello Samuel, Cypress, TX (US); Robert D. Gilcrist, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 368 days.

(21) Appl. No.: 15/266,444

(22) Filed: Sep. 15, 2016

(65) Prior Publication Data
US 2018/0073347 A1   Mar. 15, 2018

(51) Int. Cl.
| | | |
|---|---|---|
| G06G 7/48 | (2006.01) | |
| E21B 47/00 | (2012.01) | |
| E21B 17/00 | (2006.01) | |
| G06F 17/50 | (2006.01) | |

(52) U.S. Cl.
CPC ......... *E21B 47/0006* (2013.01); *E21B 17/00* (2013.01); *G06F 17/5018* (2013.01)

(58) Field of Classification Search
None
See application file for complete search history.

(56) References Cited

U.S. PATENT DOCUMENTS

| 7,273,097 B2 | 9/2007 | Fox et al. |
| 8,160,853 B2 | 4/2012 | Mitchell et al. |
| 2015/0176401 A1* | 6/2015 | Samuel .................. E21B 44/00 |
| | | 702/6 |

FOREIGN PATENT DOCUMENTS

| WO | 2015047250 | 4/2015 |
| WO | 2015094174 | 6/2015 |
| WO | 2015130406 | 9/2015 |
| WO | 2015152961 | 10/2015 |
| WO | 2016137688 | 9/2016 |

OTHER PUBLICATIONS

Tikhonov, Vadim et al. "Dynamic Model for Stiff String Torque and Drag", Mar. 5-7, 2013, SPE/IADC Drilling Conference and Exhibition, SPE. (Year: 2013).*
Tikhonov, Vadim et al., "Dynamic Model for Stiff-String Torque and Drag", Mar. 4-6, 2014, IADC/SPE Drilling Conference and Exhibition, SPE Drilling and Completion. (Year: 2014).*
(Continued)

*Primary Examiner* — Cedric Johnson
(74) *Attorney, Agent, or Firm* — Kilpatrick Townsend & Stockton LLP

(57) ABSTRACT

Damage to a casing string in a wellbore resulting from a wellbore operation can be predicted. For example, a stiff string model can be used to determine a contact point between the casing string and a well tool positionable within the casing string for performing the wellbore operation. The stiff string model can be used to determine a force of the well tool against the casing string at the contact point. The force can be used to determine a volume of damage to the casing string proximate to the contact point. A depth of a groove formed in the casing string proximate to the contact point can be determined based on the volume of damage.

23 Claims, 13 Drawing Sheets

(56) References Cited

OTHER PUBLICATIONS

Williamson, J. Steve, "Casing Wear: The Effect of Contact Pressure", 1981, Journal of Petroleum Technology, Society of Petroleum Engineers of AIME. (Year: 1981).*
Samuel, Robello et al., "Modeling Method to Estimate the Casing Wear Caused by Vibrational Impacts of the Drillstring", Mar. 4-6, 2014, IADC/SPE Drilling Conference and Exhibition, SPE. (Year: 2014).*
Kumar, Aniket et al., "Casing Wear Factors: How do They Improve Well Integrity Analysis", Mar. 17-19, 2015, SPE/IADC Drilling Conference and Exhibition, SPE. (Year: 2015).*
Moreira Junior, N.M. et al., "Worn Pipes Collapse Strength: Experimental and Numerical Study", Jun. 23, 2015, Journal of Petroleum Science and Engineering 133, Elsevier B.V. (Year: 2015).*
Last, Nigel et al., "Casing Deformation in a Tectonic Setting: Evaluation, Impact and Management", Feb. 26-28, 2002, IADC/SPE Drilling Conference, Society of Petroleum Engineering. (Year: 2002).*
Yadav, A. et al. "Casing Impairment/Damage in Stress-Sensitivity Reservoir—A Case Study", Jun. 10-12, 2003, Canadian International Petroleum Conference. (Year: 2003).*
Aichinger, F. et al. "Systematic Field Validation of New Casing Wear Quantification Process", Nov. 7-10, 2016, Abu Dhabi International Petroleum Exhibition & Conference, Society of Petroleum Engineers. (Year: 2016).*
Vavasseur, D. et al. "Casing Wear and Stiff String Modeling Sensitivity Analysis—The Contribution of DP Pipe-Body and Tool-Joint on Casing Contact", Nov. 7-10, 2016, Abu Dhabi International Petroleum Exhibition & Conference, Society of Petroleum Engineers. (Year: 2016).*
DrillScan Software Casing Wear, retrieved from the internet at http://www.drillscan.com/casing-wear, Sep. 8, 2016, 3 pages.
Hall et al., "Contact Pressure Threshold: An Important New Aspect of Casing Wear", SPE Production and Operations Symposium, Apr. 17-19, 2005, pp. 1-7.
Mitchell et al., "How Good is the Torque/Drag Model?", SPE Drilling & Completion, IADS/SPE-178833-MS Mar. 2009, pp. 62-71.
Samuel et al., "Solving the Casing Wear Puzzle Using Stiff Model", IADC/SPE Drilling Conference and Exhibition, Mar. 1-3, 2016, pp. 1-17.
International Application No. PCT/US2017/044088, International Search Report and Written Opinion dated Oct. 23, 2017, 19 pages.

* cited by examiner

DETERMINING DAMAGE TO A CASING STRING IN A WELLBORE

TECHNICAL FIELD

The present disclosure relates generally to devices used with well systems. More specifically, but not by way of limitation, this disclosure relates to a determining damage to a casing string in a wellbore.

BACKGROUND

A well system, such as an oil or gas well, can include a wellbore drilled through a subterranean formation for extracting hydrocarbons from the subterranean formation. The wellbore can include a casing string to prevent the walls of the wellbore from caving in. Well tools can be inserted into the casing string to perform operations, such as drilling operations, in the wellbore. But the casing string can become damaged as the well tools are positioned within the casing string and perform operations within the casing string.

DETAILED DESCRIPTION

Figure 1:
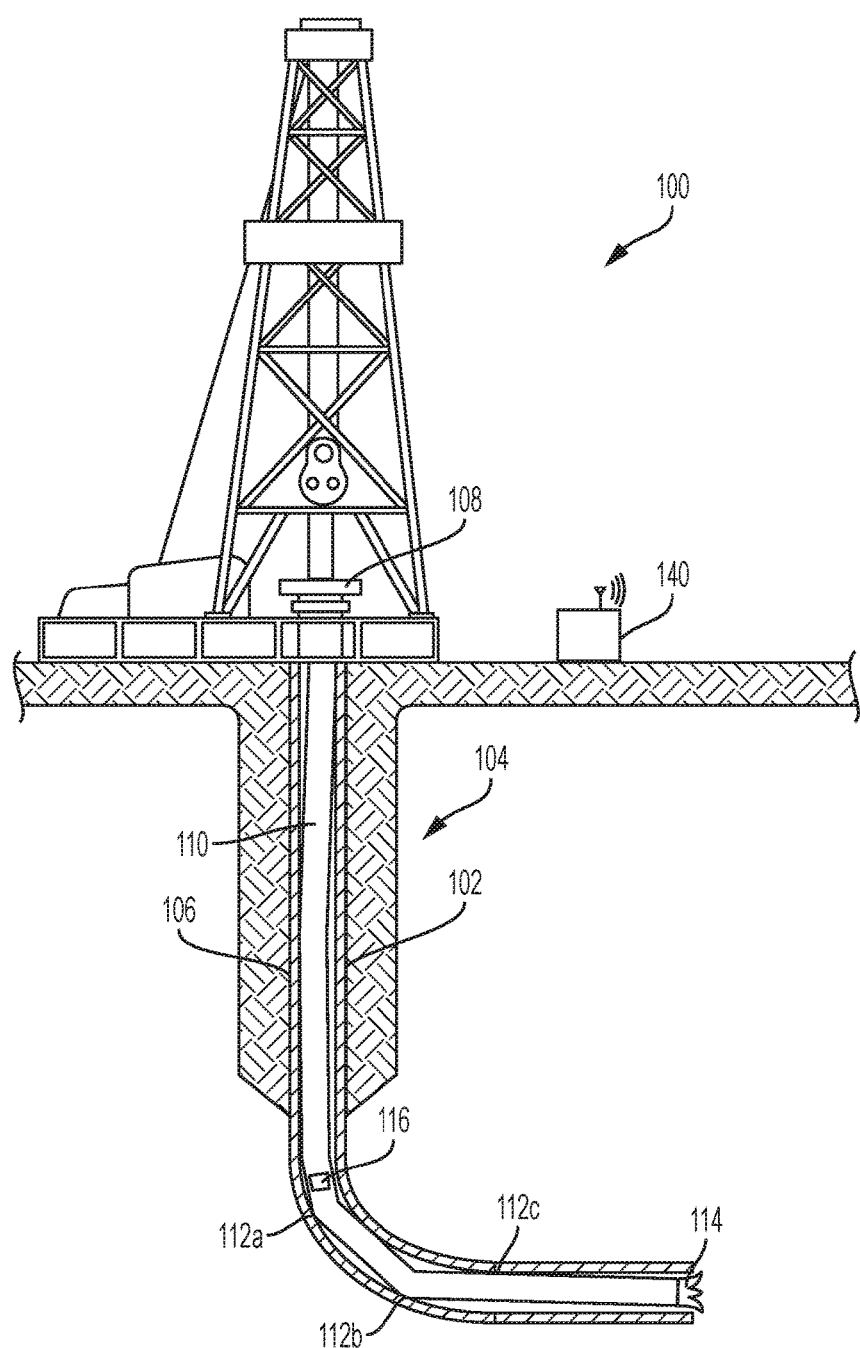
FIG. 1 is a cross-sectional side view of an example of a well system that includes a wellbore and a computing device for determining damage to a casing string in the wellbore according to some aspects.

Certain aspects and features of the present disclosure relate to using a stiff string model or a finite element method to predict damage to a casing string in a wellbore resulting from a wellbore operation, such as drilling, sliding, back-reaming, rotating off bottom, or reciprocation. The stiff string model or the finite element method can take into account the bending stiffness of a well tool to more accurately predict the movements and forces (e.g., side forces) generated by the well tool while performing the wellbore operation. The stiff string model or the finite element method can also be used to predict contact points between the well tool at given depths in the casing string while performing the wellbore operation. The movements, forces, and contact points determined using the stiff string model or the finite element method can be used to more accurately predict damage to the casing string resulting from the wellbore operation. Other modeling methods may not take the bending stiffness of the well tool into account, and may not be able to predict contact points, resulting in less accurate predictions of damage to the casing string.

More specifically, in some examples, the stiff string model can include an iterative method that accounts for the bending stiffness of a well tool. The stiff string model can include analyzing a well tool, such as a drill string, as a series of sections, rather than as a single unit. For example, a well tool can be divided into multiple sections, and a respective stiffness for each section of the well tool can be determined. In some examples, the stiffness of a section can be used, along with other information (e.g., the trajectory of the well tool inside the wellbore, the clearance between the well tool and the casing string, or both of these), to determine a contact location between the section of the well tool and the casing string. A contact force at the contact location can then be determined. In some examples, the contact force can be determined based on the kinematic forces, external forces, internal forces, or any combination of these acting on the section of the well tool. The contact force and contact location can provide a well operator with valuable information about the amount and location of damage to the casing string. In some examples, the stiff string model can be more accurate than other modeling methods, such as a soft string model, which can ignore the stiffness of the well tool and the clearance between the well tool and the casing string.

In one example, a computing device can use a stiff string model to determine a contact point between the casing string and a well tool performing a wellbore operation. The computing device can use the stiff string model to determine a force of the well tool against the casing string at the contact point. The computing device can use the force to determine a volume of damage to the casing string proximate to the contact point. The computing device can then determine a depth of a groove formed in the casing string proximate to the contact point based on the volume of damage. The computing device can repeat this process to determine a distribution of grooves in the casing string at various depths in the wellbore resulting from the wellbore operation.

In another example, a computing device can use a finite element method to determine a contact point between the casing string and a well tool performing a wellbore operation. The computing device can use the finite element method to determine a force of the well tool against the casing string at the contact point. The computing device can use the force to determine a volume of damage to the casing string proximate to the contact point. The computing device can then determine a depth of a groove formed in the casing string proximate to the contact point based on the volume of damage. The computing device can repeat this process to determine a distribution of grooves in the casing string at various depths in the wellbore resulting from the wellbore operation.

Some examples can predict damage to the casing string resulting from several, sequential wellbore operations. For example, damage to the casing string from the sequential wellbore operations can be combined or superimposed to generate a holistic representation of the damage to the casing string resulting from the combination of the wellbore operations.

Some examples can output a graphical user interface (GUI) with which a user can interact to view information about damage to the casing string at various depths and angles in the casing string. For example, the computing device can cause a display device to display a GUI having a graphical illustration of a groove formed in the casing string as a result of a wellbore operation. The graphical illustration can depict the depth of the groove proportionally to the thickness of the casing string. This can enable a user to quickly and easily determine the extent and seriousness of the damage to the casing string.

In some instances, damage to the casing string can be catastrophic, causing the well system to be entirely shutdown or abandoned. In other instances, damage to the casing string can require the well system to be shut down so that the casing string can be repaired, costing the well operator time and money. But some examples of the present disclosure can enable a well operator to avoid these issues by predicting the number, location, and depth of grooves and other types of damage to the casing string prior to the wellbore operation being performed. This can enable the well operator to perform maintenance on the casing string, more suitably design the casing string, or take other remedial measures to minimize the impact of such damage.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional side view of an example of a well system 100 that includes a wellbore 102 and a computing device 140 for determining damage to (e.g., wear on) a casing string 106 in the wellbore 102 according to some aspects. The wellbore 102 can extend through various earth strata that form a subterranean formation 104. The wellbore 102 can be vertical, deviated, horizontal, or any combination of these. The wellbore 102 can be positioned onshore or offshore.

The casing string 106 can extend from the well surface 108 to the subterranean formation 104. The casing string 106 can extend partially or entirely through the wellbore 102. In some examples, the casing string 106 can be formed from multiple casing strings having the same or different diameters from one another. The casing string 106 can provide a conduit through which formation fluids, such as production fluids produced from the subterranean formation 104, can travel from the wellbore 102 to the well surface 108. The casing string 106 can be coupled to the walls of the wellbore 102 via cement. For example, a cement sheath can be positioned or formed between the casing string 106 and the walls of the wellbore 102 for coupling the casing string 106 to the wellbore 102.

In the example shown in FIG. 1, the wellbore 102 includes a well tool 110. The well tool 110 can include a logging while drilling (LWD) tool or a measuring while drilling (MWD) tool. In some examples, the well tool 110 can be coupled to a wireline, slickline, or coiled tube for deploying the well tool 110 into the wellbore 102. The well tool 110 can include various sensors, subsystems, and components. For example, the well tool 110 can include a communication subsystem, a saver subsystem, a rotary steerable system, a mud motor, a MWD module, a bottom hole assembly, a gap subsystem, a drill bit 114, or any combination of these. In other examples, the wellbore 102 may not include the well tool 110.

The well tool 110 can contact the casing string 106 at one or more points 112a-c while being positioned in the wellbore 102 or after being positioned in the wellbore 102. For example, the well tool 110 can contact the casing string 106 at the points 112a-c while performing an operation, such as a drilling operation, subsequent to being positioned in the wellbore 102. Contacts between the well tool 110 and the casing string 106 can damage (e.g., wear down, crack, impart grooves or crevices in, etc.) the casing string 106. In some instances, damage to the casing string 106 can be catastrophic, causing the well system 100 to be entirely shutdown or abandoned. In other instances, damage to the casing string 106 can require the well system 100 to be shut down so that the casing string 106 can be repaired, costing the well operator time and money. But some examples of the present disclosure can use the computing device 140 to prospectively determine (e.g., predict) damage to the casing string 106 as a result of these contacts. This can enable the well operator to more suitably design the casing string 106 prior to the well tool 110 being positioned in the wellbore 102.

In some examples, the computing device 140 can additionally or alternatively determine actual damage to the casing string 106 as a wellbore operation is being performed in the wellbore 102 or after the wellbore operation is complete. This can enable the well operator to perform maintenance on the casing string 106 (e.g., before the damage becomes catastrophic). In some examples, the computing device 140 can determine the actual damage to the casing string 106 based on sensor data from one or more sensors, such as sensor 116 (e.g., coupled to the well tool 110). The sensor 116 can detect characteristics of the well tool 110, characteristics of the casing string 106, characteristics of an environment in the wellbore 102, or both of these. Examples of the characteristics of the well tool 110 can include a depth of the well tool 110 or a component of the well tool 110 (e.g., a depth of the drill bit 114) in the wellbore 102; a position of the well tool 110 in the wellbore 102; a rate of speed or torque associated with a component (e.g., a motor) of the well tool 110; an amount of force or strain on a component of the well tool 110; or any combination of these. Examples of the characteristics of the casing string 106 can include a presence and location of a crack, ding, dent, scratch, wear, or other damage. Examples of the characteristics of the environment in the wellbore 102 can include a pressure, temperature, fluid, or any combination of these in the wellbore 102. In some examples, the sensor 116 can include a temperature sensor, pressure sensor, fluid-flow sensor, fluid-type sensor, accelerometer, strain gauge, gyroscope, camera, microphone, or any combination of these. The sensor 116 can transmit sensor data to the computing device 140 for use by the computing device 140 in determining the damage to the casing string 106.

Figure 2:
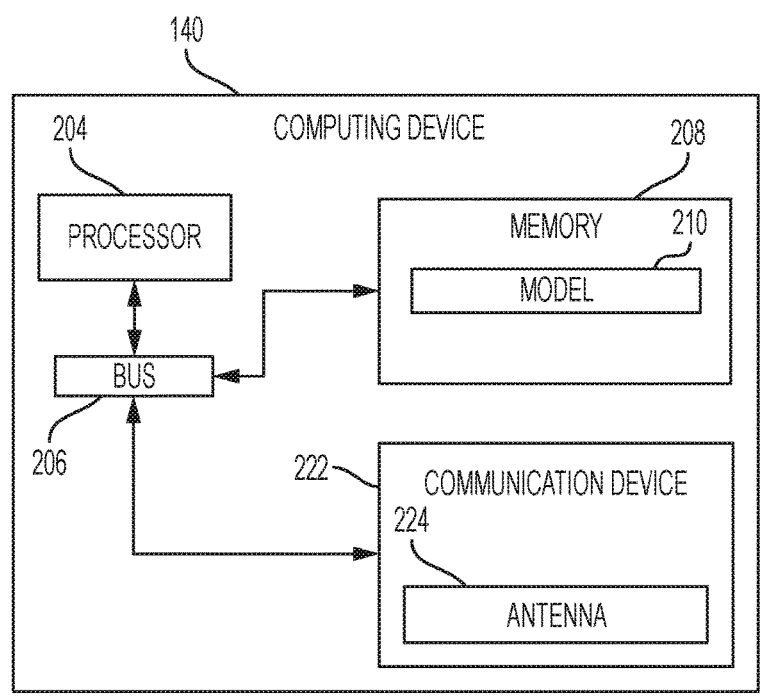
FIG. 2 is a block diagram of an example of the computing device of FIG. 1 according to some aspects.

FIG. 2 is a block diagram of an example of the computing device 140 of FIG. 1 according to some aspects. The computing device 140 can include a processor 204, a memory 208, a bus 206, and a communication device 222. In some examples, some or all of the components shown in FIG. 2 can be integrated into a single structure, such as a single housing. In other examples, some or all of the components shown in FIG. 2 can be distributed (e.g., in separate housings) and in electrical communication with each other.

The processor 204 can execute one or more operations for determining damage to a casing string in a wellbore. The processor 204 can execute instructions stored in the memory 208 to perform the operations. The processor 204 can include one processing device or multiple processing devices (e.g., distributed and in communication with one another). Non-limiting examples of the processor 204 include a Field-Programmable Gate Array ("FPGA"), an application-specific integrated circuit ("ASIC"), a microprocessor, etc.

The processor 204 can be communicatively coupled to the memory 208 via the bus 206. The non-volatile memory 208 may include any type of memory device that retains stored information when powered off. Non-limiting examples of the memory 208 include electrically erasable and programmable read-only memory ("EEPROM"), flash memory, or any other type of non-volatile memory. In some examples, at least some of the memory 208 can include a medium from which the processor 204 can read instructions. A computer-readable medium can include electronic, optical, magnetic, or other storage devices capable of providing the processor 204 with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

The communications device 222 can be implemented using hardware, software, or both. The communications device 222 can receive communications from, and transmit communications to, a well tool or a sensor (e.g., sensor 116 of FIG. 1) downhole. The communications device 222 can include a wired or wireless interface for communicating with the well tool or sensor. For example, the communications device 222 can include an antenna 224 for wirelessly communicating with the sensor or a wire coupled to the well tool for communicating with a sensor disposed in the well tool. In some examples, the communications device 222 can include hardware or software configured to allow the communications device 222 to receive signals from the well tool or sensor and amplify, filter, modulate, de-modulate, frequency shift, and otherwise manipulate the signals. The communications device 222 can transmit the manipulated signals to the processor 204 for further processing (e.g. for determining damage to the casing string in the wellbore).

The memory 208 can include one or more equations or models 210 for determining damage to a casing string in a wellbore. For example, the memory 208 can include a stiff string model (e.g., as discussed in greater detail below) or a finite element method for determining the damage to the casing string.

Figure 3:
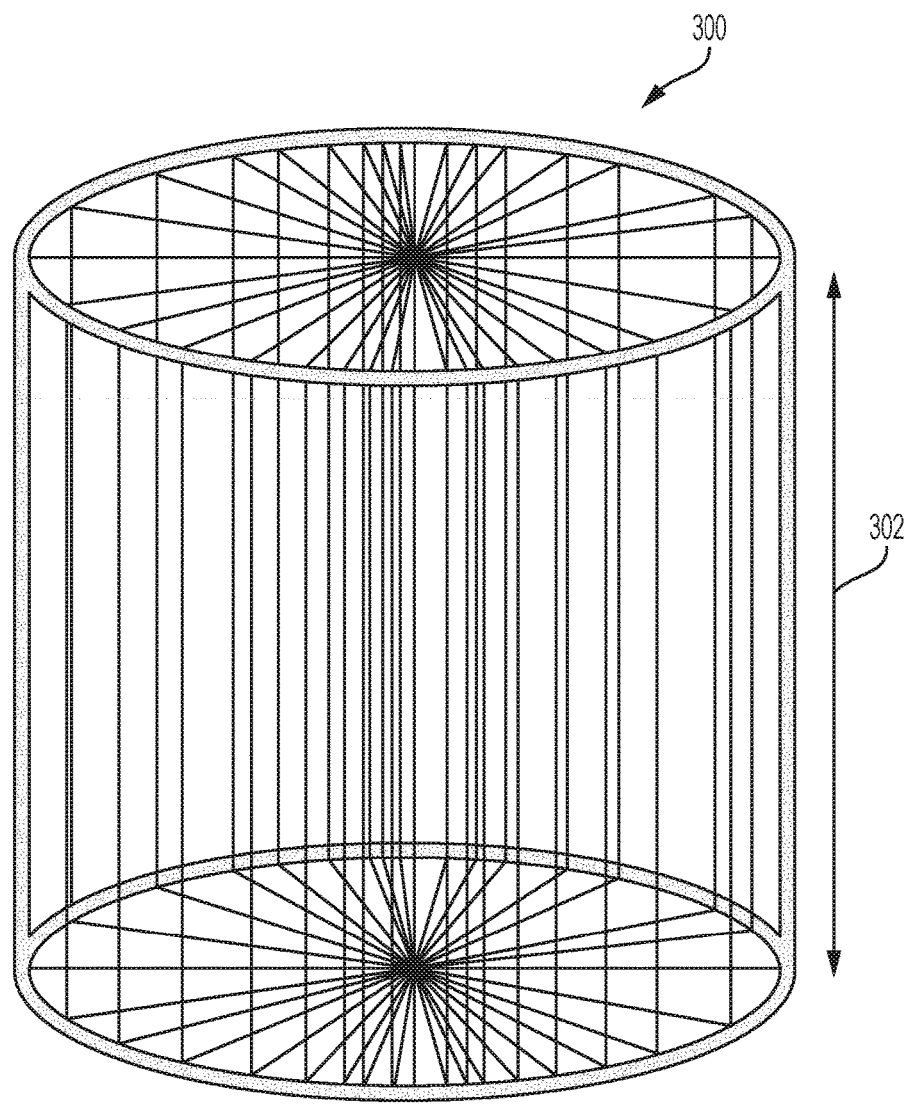
FIG. 3 is a perspective view of an example of a section of a casing string according to some aspects.
Figure 4:
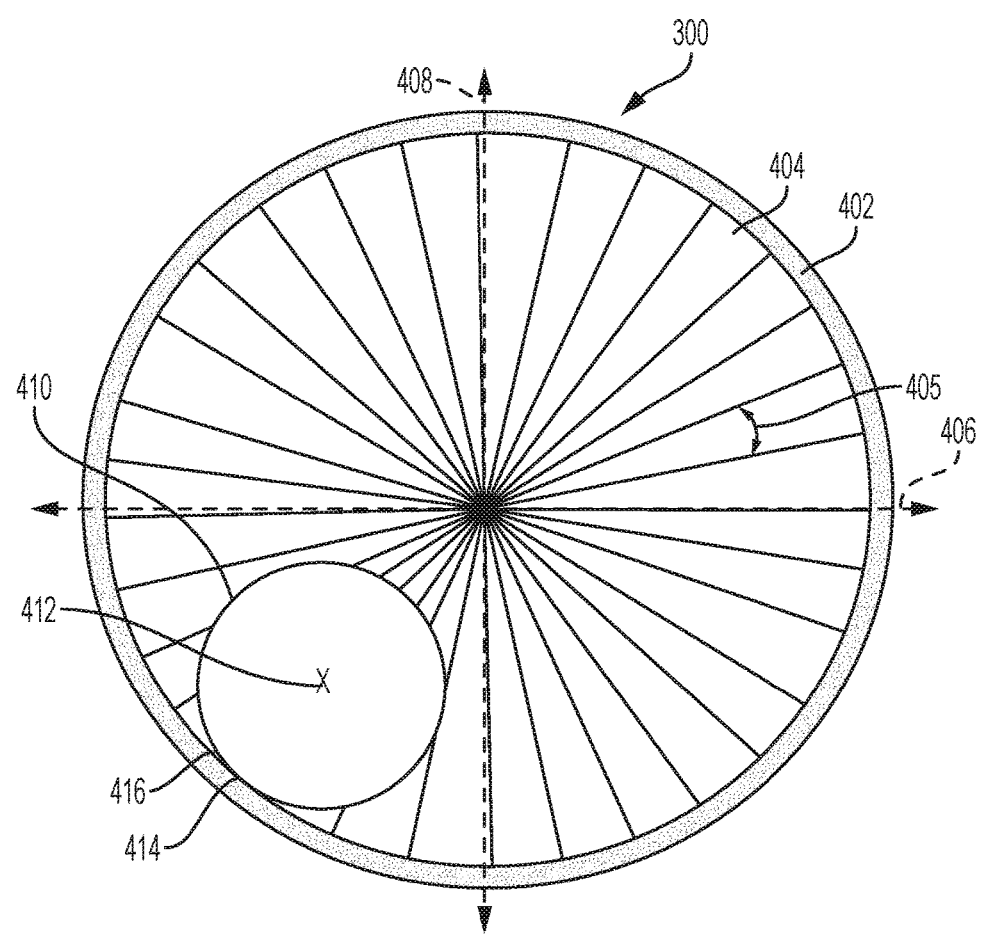
FIG. 4 is a cross-sectional end view of an example of a casing string segmented into five-degree slices according to some aspects.

In some examples, the computing device 140 can generate a virtual representation of a section of the casing string. The virtual representation can be a three-dimensional representation (e.g., a three-dimensional mesh), such as the three-dimensional representation shown in FIG. 3. The section 300 can have a predetermined length 302, such as 10 feet, and correspond to an actual section of a casing string in the wellbore. The length 302 can be customizable by a user. Additionally, and now turning to FIG. 4, the computing device 140 can divide the circumference 402 of the section 300 into slices 404 having a predetermined arc angle 405, such as five degrees. The number of slices and arc angle 405 can be customizable by the user. In some examples, the computing device 140 can determine damage (e.g., a presence, number, location, and depth of grooves) to each slice 404 of the section 300 of the casing string (e.g., using one or more of the processes discussed below). The computing device 140 can provide information related to damage in the section 300 of the casing string to the user via a graphical user interface (e.g., as discussed with respect to FIGS. 12-13 below). For example, the computing device 140 can output, on a display device, a graphical illustration of the locations of grooves around the circumference of the section 300 of the casing string. In some examples, the computing device 140 can repeat the above process for multiple sections 300 (e.g., all of the sections) of the casing string. The computing device 140 can enable the user to manipulate the graphical user interface to view damage in different sections of the casing string.

Figure 5:
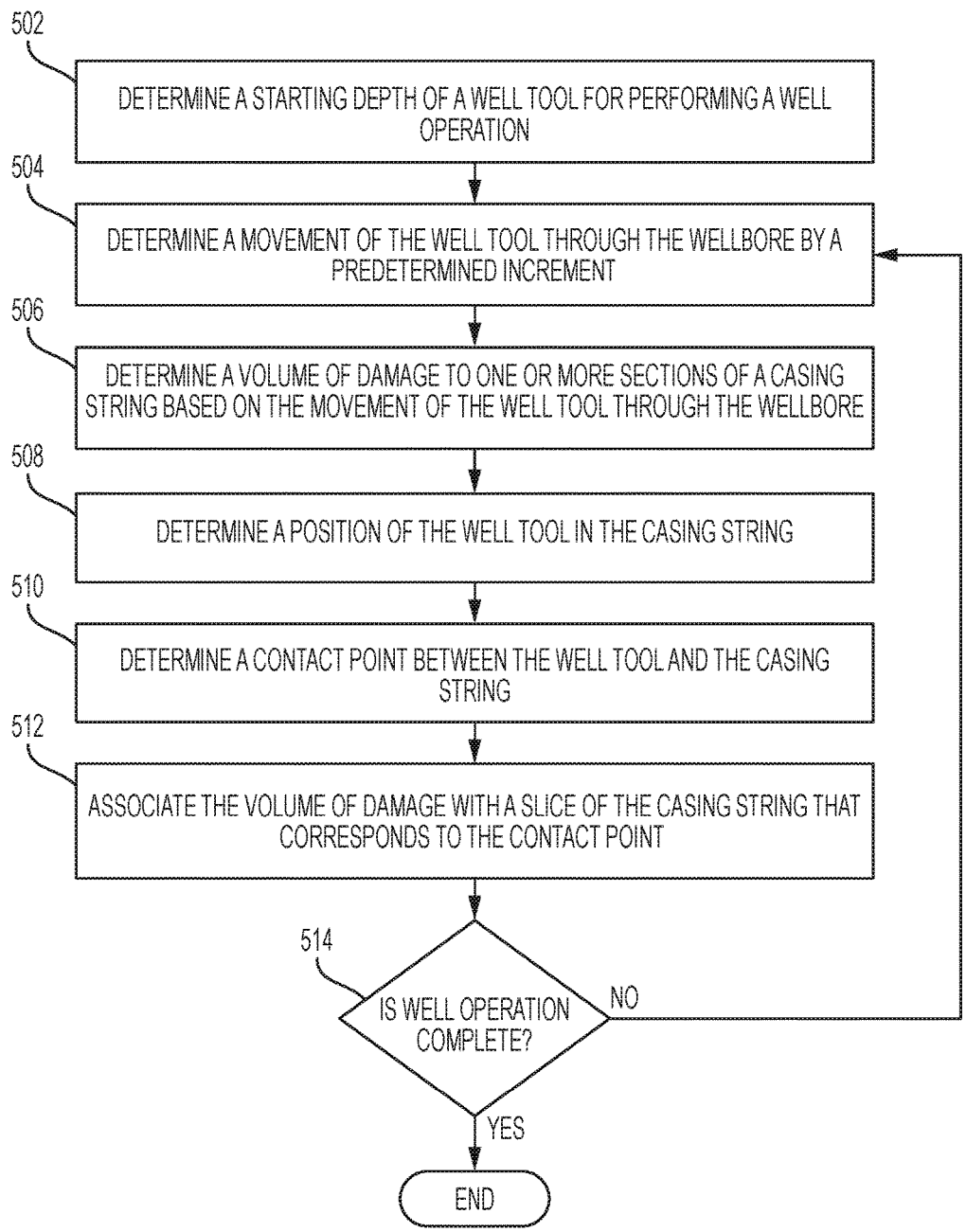
FIG. 5 is a flow chart showing an example of a process for determining a volume of damage in a slice of a casing string according to some aspects.

FIG. 5 is a flow chart showing an example of a process for determining a volume of damage in a slice (e.g., slice 404 of FIG. 4) of a casing string according to some aspects. Some examples can include more, fewer, or different steps than the steps depicted in FIG. 5. Also, some examples can implement the steps of the process in a different order. The steps below are described with reference to the components shown in FIG. 2.

In block 502, the computing device 140 determines a starting depth of a well tool, such as a drill string, in the wellbore for performing a wellbore operation. The starting depth can be the initial depth of the well tool in the wellbore at which the wellbore operation is to be performed. In one example, the starting depth is 100 feet from the well surface. The starting depth can be an actual depth of a real well tool in a wellbore for performing a real wellbore operation, or a virtual depth of a virtual well tool in a simulated wellbore for performing a simulated wellbore operation.

In some examples, the computing device 140 can receive user input (e.g., via a keyboard, mouse, touch-screen display, or any combination of these) indicating the starting depth of the well tool. In other examples, the computing device can retrieve the starting depth from memory 208, such as from a database stored in memory 208. In still other examples, the computing device 140 can receive the information indicating the starting depth of the well tool from a sensor (e.g., sensor 116 of FIG. 1).

In block 504, the computing device 140 determines a movement of the well tool through the wellbore by a predetermined increment, such as 30 feet, resulting from the wellbore operation being performed. In some examples, the predetermined increment can be provided by a user. The computing device 140 can simulate the movement of a virtual well tool through a simulated wellbore by the predetermined increment. For example, the computing device 140 can simulate a virtual drill string drilling 30 ft further downhole from the starting depth. Additionally or alternatively, a well operator can cause a real well tool to move through a real wellbore by the predetermined increment. The computing device 140 can receive sensor data indicating the movement of the well tool through the wellbore by the predetermined increment. Movement of the well tool (e.g., either simulated or real) through the wellbore may change the configuration of the well tool in the wellbore such that the well tool contacts the casing string in at least one location.

In block 506, the computing device 140 determines a volume of damage to a section (e.g., the section 300 of FIG. 3) of the casing string based on the movement of the well tool through the wellbore. For example, if each section of the casing string is 10 feet long and the well tool moves 30 feet through the wellbore, the computing device 140 can determine the respective volumes of damage to each of the three, adjacent sections affected by the movement of the well tool.

The computing device 140 can determine different volumes of damage based on the wellbore operation being performed. For example, the computing device 140 can determine a volume of damage resulting from a wellbore operation that involves rotating the well tool, such as drilling or backreaming, using the following equation:

$$VOD = W_f \times SF_{tj} \times \pi \times D_{tj} \times RPM \times 60 \times t \times \frac{L_{tj}}{L_p}$$

where VOD can represent the volume of damage; $W_f$ can represent the wear factor; $SF_{tj}$ can represent a side force of the well tool against the casing string (e.g., a force of a contact between the well tool and a wall of the casing string); $D_{tj}$ can represent an outer diameter of the well tool (e.g., the outer diameter of a drill string); RPM can represent a rotary speed, in revolutions per minute, of the well tool (e.g., the rotary speed of a drill string); t can represent a time in hours; $L_{tj}$ can represent a length of a joint of the well tool; and $L_p$ can represent a length of the well tool.

The volume of damage (VOD) can indicate the volume of the casing wall removed over t hours as a result of a contact, having side force $SF_{tj}$, between the well tool and the casing string. In some examples, the wear factor can be determined by experiment. The wear factor can be based on a characteristic of the well tool, the casing string, the wellbore, or any combination of these. For example, the computing device 140 can receive user input indicating a type of fluid in the wellbore, a material of the casing string, a type of the well tool, or any combination of these. The computing device 140 can then determine the wear factor based on a relationship between one or more of these characteristics. In some examples, the wear factor, side force, outer diameter, rotary speed, time, length of the joint of the well tool, length of the well tool, or any combination of these can be provided by a user, a sensor, or both. For example, a sensor (e.g., sensor 116 of FIG. 1) can detect the rotary speed and transmit an associated sensor signal to the computing device 140.

In some examples, the computing device 140 can determine a volume of damage resulting from a wellbore operation that does not involve rotating the well tool, such as a sliding operation, using the following equation:

$$DV = W_f \times SF_{tj} \times d_{sld} \times 12 \times t \times \frac{L_{tj}}{L_p}$$

where $d_{sld}$ can represent a sliding distance (e.g., the distance of the movement of the well tool, such as 30 ft). In some examples, the sliding distance can be provided by a user or sensor. For example, sensors can detect the sliding distance and transmit associated sensor signals to the computing device 140.

In some examples, the computing device 140 can determine a volume of damage resulting from a wellbore operation that involves reciprocating the well tool using the following equations:

$$DV = W_f \times SF_{tj} \times d_{rcp} \times \frac{L_{tj}}{L_p}$$

where $d_{rcp} = \sqrt{(L_{stk} \times 12)^2 + (\pi \times D_{tj} \times RPM_r \times t_{sk})^2}$ and where $L_{stk}$ can represent a stroke length in feet; $RPM_r$ can represent a rotary speed of the well tool while reciprocating; and $t_{sk}$ can represent a stroke time in minutes. In some examples, the stroke length, rotary speed, stroke time, or any combination of these can be provided by a user or sensor. For example, sensors can detect the stroke length, rotary speed, and stroke time and transmit associated sensor signals to the computing device 140.

The above equations depend on the side force ($SF_{tj}$). Thus, the more accurate the determination of the side force is, the more accurate the determination of the volume of damage may be. Several methods, having varying levels of accuracy, can be used to determine the side force.

For example, the computing device 140 can determine the side force using a soft string torque-and-drag model, which can be referred to as the soft string model. But the soft string model can have disadvantages. For example, the soft string model can neglect the bending stiffness of the components of the well tool, so that the behavior of the well tool is modelled to behave similarly to a cable or chain. Also, the soft string model can require the trajectory of the well tool to be the same as the trajectory of the wellbore. Further, the soft string model can require contact between the well tool and the casing string to be continuous through the wellbore. These limitations can make the soft string model less accurate than other approaches.

Alternatively, the computing device 140 can determine the side force using a stiff string torque-and-draft model, which can be referred to as the stiff string model. The stiff string model may not have the abovementioned limitations of the soft string model, and may therefore provide a more accurate side force value than the soft string model. Further, in some examples, the stiff string model can be used to determine the location and configuration of the well tool within the wellbore (e.g., before or after the movement of the well tool). This may not be possible using the soft string model.

For example, the stiff string model can include the following equation:

$$\vec{M} = EI * k * \vec{b} + M_t \vec{t}$$

where $\vec{M}$ is the moment for a circular pipe; EI is a bending stiffness; k is a wellbore curvature (in.$^{-1}$); $\vec{b}$ is a binormal vector; $M_t$ is an axial torque (lbf-in.); and $\vec{t}$ is a tangent vector. This equation takes into account the bending stiffness (EI) to determine the moment for the circular pipe ($\vec{M}$). In some examples, the moment of the circular pipe may be used in one or more other equations of the stiff string model, causing the stiff string model to inherently rely on the bending stiffness in these other equations. Additional information related to stiff string models may be included in R. F. Mitchell and R. Samuel, "How Good Is the Torque/Drag Model?" Society of Petroleum Engineers (SPE) paper 105068 (2009).

As discussed above, the computing device 140 can determine respective volumes of damage to multiple sections of the casing string (e.g., each section of the casing string) based on the movement of the well tool through the wellbore. The process can then continue to block 508.

In block 508, the computing device 140 determines a position of the well tool within the casing string. For example, returning to FIG. 4, the computing device 140 can determine the position of a portion of the well tool 410 within the cross-sectional plane of the section 300. In some examples, the computing device 140 can determine the position of the portion of the well tool 410 using the stiff string model or the finite element method. The computing device 140 can determine the position of the portion of the well tool 410 along an X-axis 406, which can be referred to as the "right position," in the cross-sectional plane of the section 300. The computing device 140 can additionally or alternatively determine the position of the well tool 410 along a Y-axis 408, which can be referred to as the "high position," in the cross-sectional plane of the section 300. The computing device 140 can use the right position and the high position as coordinates for the center 412 of the portion of the well tool 410.

The well tool 410 can include various bends, curves, components, or other characteristics that can cause different portions of the well tool 410 to be positioned differently in different sections of the casing string. In some examples, the computing device 140 can determine the positions of different portions of the well tool 410 within the different sections of the casing string. For example, the computing device 140 can determine the right position and the high position of each respective portion of the well tool 410 within each respective section 300 of the casing string.

In block 510, the computing device 140 determines a contact point between the well tool and the casing string. The computing device 140 can determine the contact point based on the position of the well tool within the casing string. For example, returning to FIG. 4, the computing device 140 can determine the location of the center 412 of the portion of the well tool 410 within the section 300 of the casing string. The computing device 140 can also determine a radius or diameter of the portion of the well tool 410 (e.g., by accessing information stored in memory 208 or based on input by a user). The computing device 140 can determine, based on the location and the radius or diameter of the portion of the well tool 410, if the well tool 410 is contacting the casing string. If so, the computing device 140 can determine the contact point 414.

In block 512, the computing device 140 associates the volume of damage (e.g., determined in block 506) with the slice of the casing string that corresponds to the contact point. For example, referring to FIG. 4, the computing device 140 can associate the volume of damage with the slice 416 based on the location of the contact point 414 being within the slice 416. In some examples, the computing device 140 can repeat this process for each contact point in each section of the casing string.

In block 514, the computing device 140 determines if the wellbore operation is complete. For example, the computing device 140 can determine if a drill bit is at a final bit depth for a drilling operation. If so, the computing device 140 can end the process. Otherwise, the process can return to block 504, where the computing device 140 can determine another movement of the well tool in the wellbore (e.g., another increment of drilling in a drilling operation).

Although some of the examples and steps above are implemented using a stiff string model, these examples and steps can alternatively be implemented using a finite element method. For example, the equations, steps, processes, or any combination of these discussed above can be implemented as a part of the finite element method for determining damage to a casing string in a wellbore.

Figure 6:
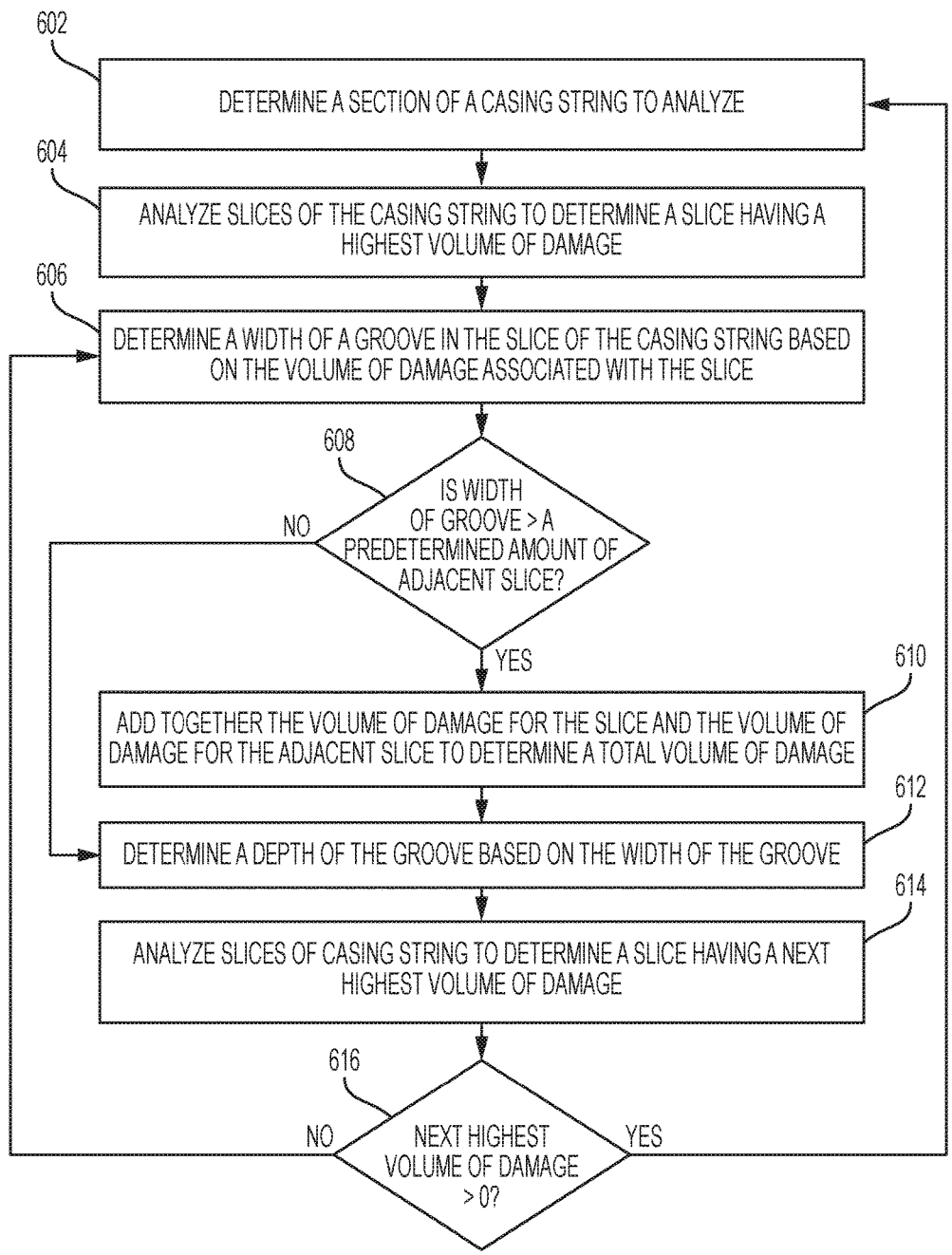
FIG. 6 is a flow chart showing an example of a process for determining characteristics of a groove in a slice of a casing string according to some aspects.

FIG. 6 is a flow chart showing an example of a process for determining characteristics of a groove in a slice (e.g., slice 404 of FIG. 4) of a casing string according to some aspects. Some examples can include more, fewer, or different steps than the steps depicted in FIG. 6. Also, some examples can implement the steps of the process in a different order. The steps below are described with reference to the components shown in FIG. 2.

In block 602, the computing device 140 determines a section of the casing string to analyze. For example, the computing device 140 can divide the casing string into sections having a predetermined length, as discussed above with respect to FIG. 3. The computing device 140 can then select a particular section of the casing string to analyze. In some examples, the computing device 140 can select a section of the casing string for which a volume of damage was determined using the process described in FIG. 5. In other examples, the computing device 140 can select the section of the casing string closest to the well surface.

In block 604, the computing device 140 analyzes all of the slices in the section of the casing string to determine the slice that has the highest volume of damage.

Figure 7:
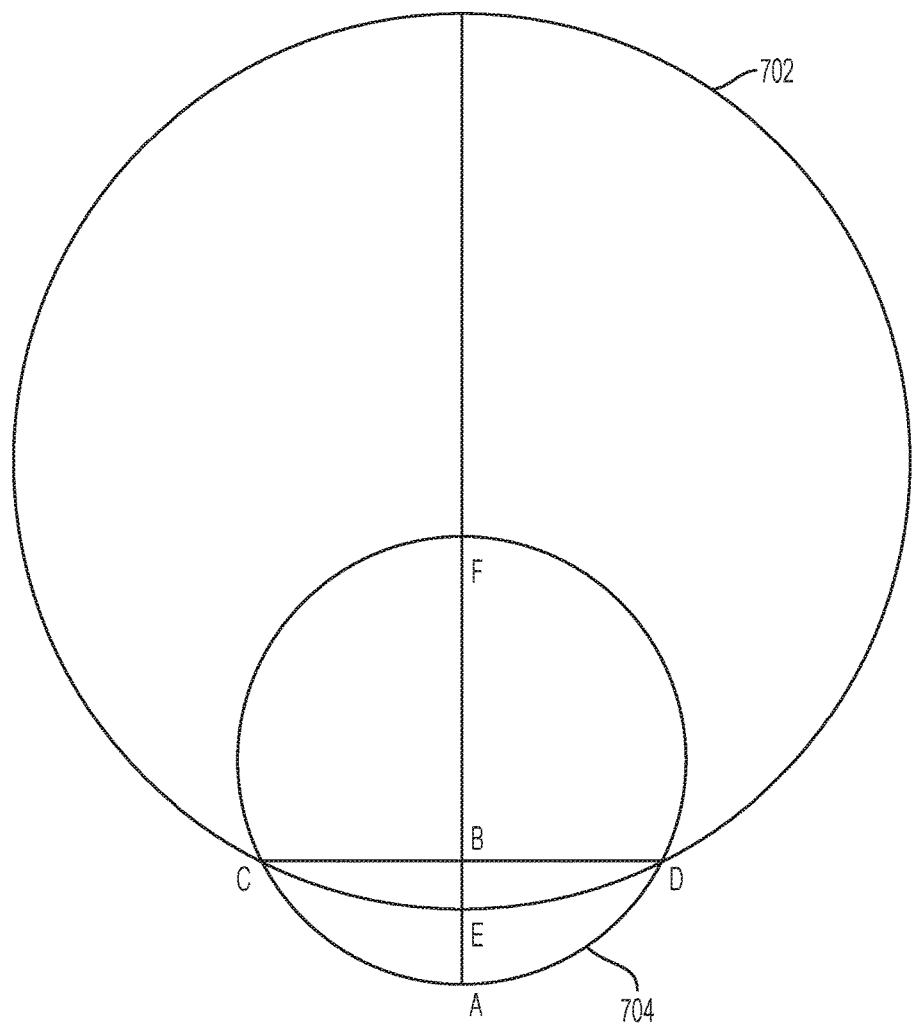
FIG. 7 is a model of an example of a well tool contacting a casing string according to some aspects.

In block 606, the computing device 140 determines a width of a groove in the slice (e.g., determined in block 604) of the casing string based on the volume of damage associated with the slice. The computing device 140 can use a relationship between the outer diameter of the well tool, the inner diameter of the casing string, and the volume of damage to determine the width of the groove. For example, referring to FIG. 7, the well tool has an outer diameter 704. The casing string has an inner diameter 702. Contact between the well tool and the casing string can generate a groove having a crescent shape defined by points A, C, E, and D. The width of the groove can be a distance between points C and D. The height of the groove can be a distance between points E and A. The computing device 140 can use a geometrical relationship between the outer diameter 704 of the well tool, the inner diameter 702 of the casing string, and the volume of damage to determine the width of the groove between points C and D. The computing device 140 can associate the width of the groove with the slice of the casing string.

Figure 8:
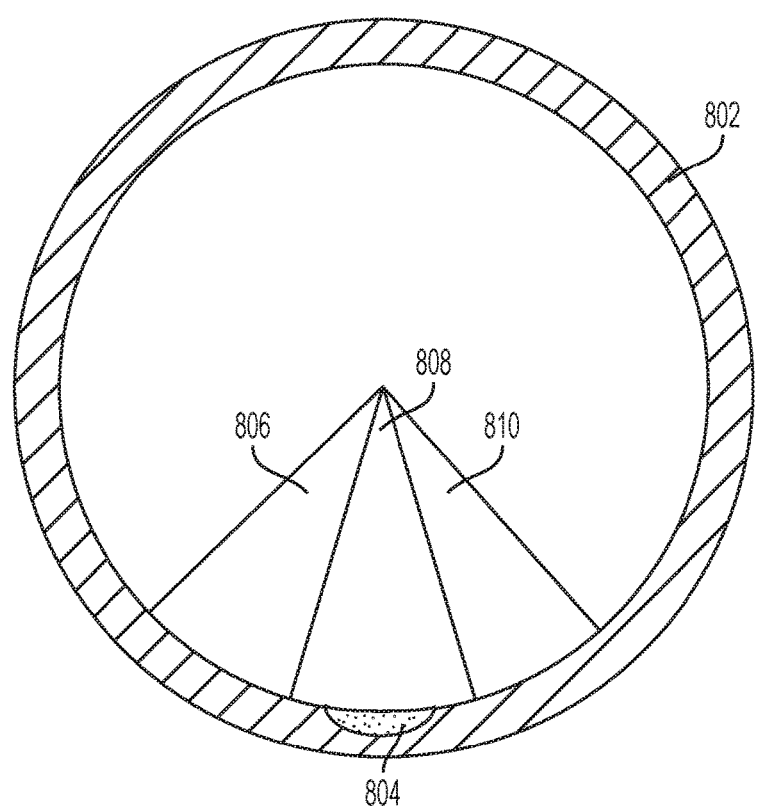
FIG. 8 is a cross-sectional end view of an example of a casing string having a groove spanning less than 50% of a slice according to some aspects.
Figure 9:
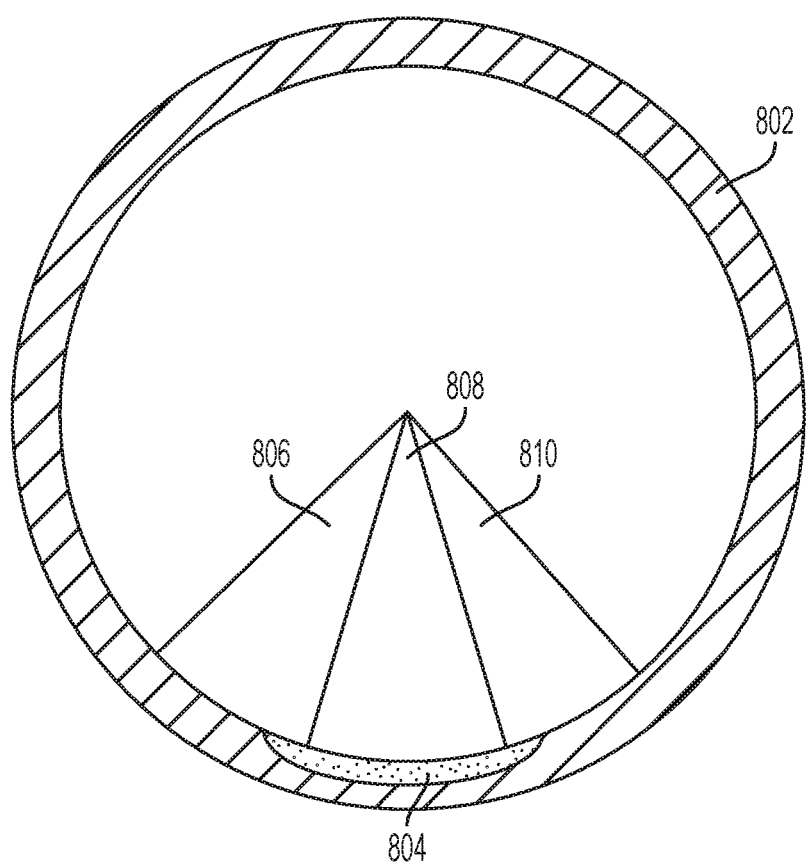
FIG. 9 is a cross-sectional end view of an example of a casing string having a groove spanning less than 50% of an adjacent slice according to some aspects.
Figure 10:
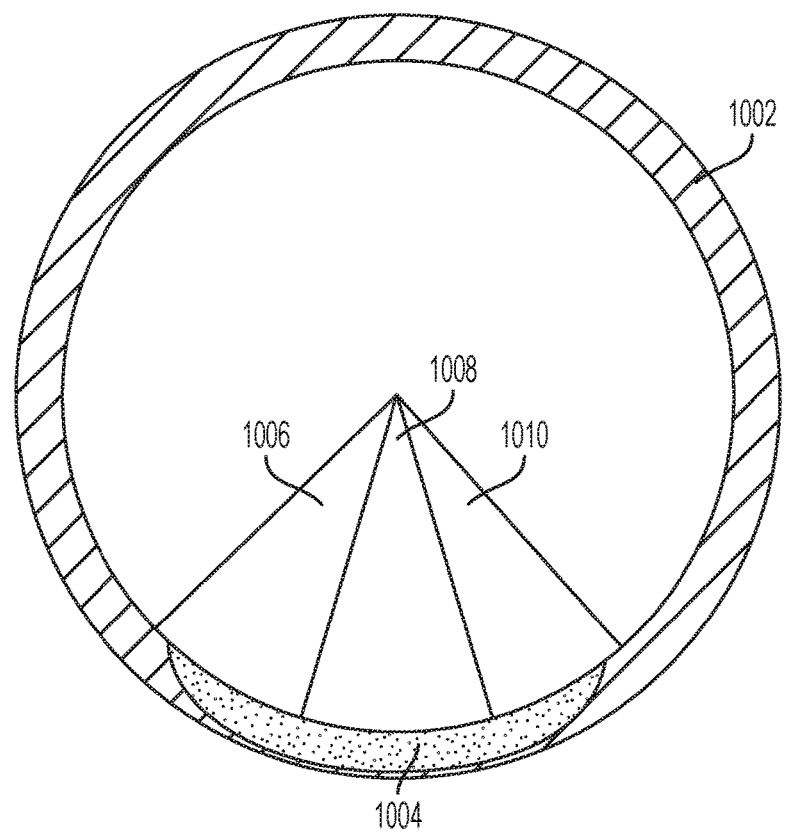
FIG. 10 is a cross-sectional end view of an example of a casing string having a groove spanning more than 50% of an adjacent slice according to some aspects.

In block 608, the computing device 140 determines if the width of the groove spans more than a predetermined amount of an adjacent slice in the casing string. For example, the computing device 140 can determine if the width of the groove spans more than 50% of an adjacent slice in the casing string. FIGS. 8-9 show examples of grooves 804 that are in a slice 808 and do not span more than 50% of adjacent slices 806, 810 in the casing string 802. FIG. 10 shows an example of a groove 1004 that is in a slice 1008 and spans more than 50% of adjacent slices 1006, 1010 in the casing string 1002. If the computing device 140 determines that the width of the groove spans more than the predetermined amount of the adjacent slice in the casing string, the process can continue to block 610. Otherwise, the process can continue to block 612.

In block 610, the computing device 140 adds together the volume of damage for the slice and the volume of damage for the adjacent slice(s) to determine a total volume of damage for the combined slices. For example, referring to FIG. 10, the computing device 140 can add together the volumes of damage corresponding to the slices 1006, 1008, 1010 to determine the total volume of damage for the slices 1006, 1008, 1010. The computing device 140 can treat or analyze the slices 1006, 1008, 1010 together as a single slice in some or all of the remaining steps of the process. The process can continue to block 612.

In block 612, the computing device 140 determines a depth of the groove based on the width of the groove. In some examples, the computing device 140 can determine the depth of the groove (in the casing string) using the following equation:

$$d = r - R + 0.5 * (\sqrt{(4*R^2 - W^2)} - \sqrt{(4*r^2 - W^2)})$$

where d can represent the depth of the groove; r can represent the outer radius of the well tool; R can represent the inner radius of the casing string; and W can represent the width of the groove. The computing device 140 can associate the depth of the groove with the slice of the casing string.

In block 614, the computing device 140 analyzes the remaining slices in the section of the casing string to determine the slice that has the next highest volume of damage.

In block 616, the computing device 140 determines if the next highest volume of damage is zero. If not, the process can return to block 606, where the computing device 140 can repeat the steps of block 606-616 for the slice that has the next highest volume of damage in the casing string. In this manner, the computing device 140 can determine the number, locations, and depths of grooves in a section of the casing string. If the computing device 140 determines that the next highest volume of damage is zero, the process can return to block 602, where the computing device 140 can select another section of the casing string to analyze. In some examples, the computing device 140 can repeat the steps shown in blocks 602-616 until there are no more sections of the casing string to analyze.

In some examples, multiple wellbore operations can be performed in the casing string. For example, a well operator can use one or more well tools to multiple perform wellbore operations, such as drilling, sliding, backreaming, rotating off bottom, and reciprocation, in the wellbore. Each wellbore operation can damage the casing string in a different manner, and the damage from one wellbore operation can affect the total damage at the end of a subsequent operation. Some examples of the present disclosure can determine (e.g., predict) a cumulative amount of damage resulting from multiple wellbore operations.

Figure 11:
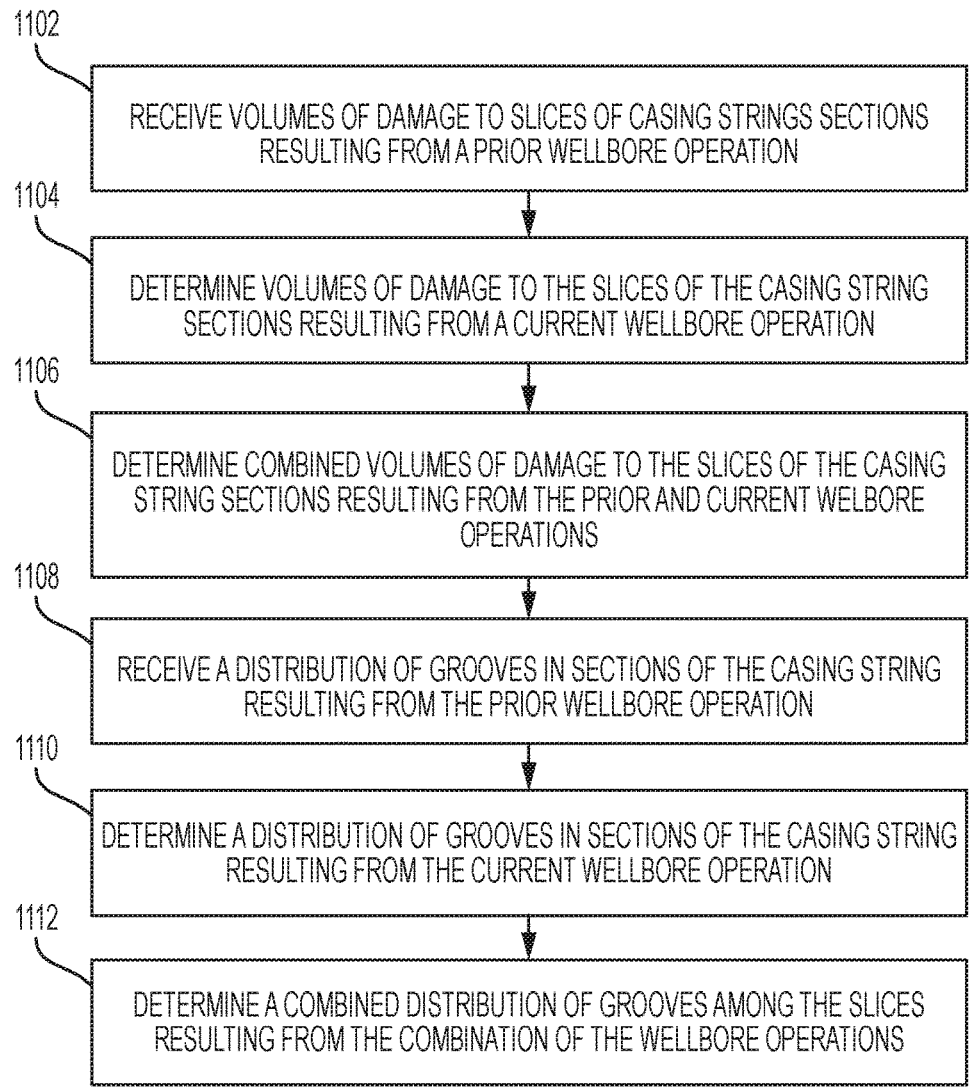
FIG. 11 is a flow chart showing an example of a process for determining damage to a casing string resulting from multiple wellbore operations according to some aspects.

FIG. 11 is a flow chart showing an example of a process for determining damage to a casing string in a wellbore resulting from multiple wellbore operations according to some aspects. Some examples can include more, fewer, or different steps than the steps depicted in FIG. 11. Also, some examples can implement the steps of the process in a different order. The steps below are described with reference to the components shown in FIG. 2.

In block 1102, the computing device 140 receives volumes of damage to slices of casing string sections resulting from a prior wellbore operation. For example, the computing device 140 can perform the process of FIG. 5 to determine the volumes of damage to the slices of the casing string sections resulting from the prior wellbore operation. The computing device 140 can store the volumes of damage in memory 208. The computing device 140 can then retrieve the volumes of damage from the memory 208 at a later time.

Additionally or alternatively, in some examples the computing device 140 can receive the volumes of damage from a sensor (e.g., sensor 116 of FIG. 1). For example, the sensor can detect actual volumes of damage to the casing string and transmit sensor signals to the computing device 140. The computing device 140 can receive the sensor signals and determine the volumes of damage based on the sensor signals.

In block 1104, the computing device 140 determines volumes of damage to the slices of the casing string sections resulting from a current wellbore operation. For example, the computing device 140 can perform the process of FIG. 5 to determine the volumes of damage to the slices of the casing string sections resulting from the current wellbore operation.

In block 1106, the computing device 140 determines combined volumes of damage to the slices of the casing string sections resulting from the prior and current wellbore operations. For example, the computing device 140 can add together or superimpose the volumes of damage resulting from the prior wellbore operation with the volumes of damage resulting from the current wellbore operation.

In block 1108, the computing device 140 receives a distribution of grooves in sections of the casing string resulting from the prior wellbore operation. For example, the computing device 140 can perform the process of FIG. 6 to determine the distribution of grooves resulting from the prior wellbore operation. The computing device 140 can store the distribution of grooves in memory 208. The computing device 140 can then retrieve the distribution of grooves from memory 208 at a later time.

Additionally or alternatively, in some examples the computing device 140 can receive the distribution of damage among the slices from a sensor. For example, the sensor can detect actual grooves in the casing string, the locations of the grooves, or both and transmit sensor signals to the computing device 140. The computing device 140 can receive the sensor signals and determine the distribution of grooves based on the sensor signals.

In block 1110, the computing device 140 determines another distribution of grooves in sections of the casing string resulting from the current wellbore operation. For example, the computing device 140 can perform the process of FIG. 6 for the current wellbore operation to determine the other distribution of grooves.

In block 1112, the computing device 140 determines a combined distribution of grooves among the slices resulting from the combination of the wellbore operations. For example, the computing device 140 can add together or superimpose the distribution of grooves resulting from the prior wellbore operation with the distribution of grooves resulting from the current wellbore operation.

In some examples, the computing device 140 can repeat the steps shown in FIG. 11 for subsequent wellbore operations. The computing device 140 can use the output of blocks 1106 and 1112 as the input for blocks 1102 and 1108, respectively. By using the outputs from blocks 1106 and 1112 as inputs for blocks 1102 and 1108, respectively, the computing device 140 can determine cumulative volumes of damage and a cumulative distribution of grooves resulting from all of the wellbore operations.

In some examples, the computing device 140 can cause information related to damage to the casing string be output via a GUI. For example, the computing device 140 can transmit a display signal to a display device to cause the display device to output a GUI. The GUI can include graphical representations or indications of any of the information determined or described above with respect to FIGS. 5, 6, and 11. Examples of the GUI are described below with respect to FIGS. 12-13.

Figure 12:
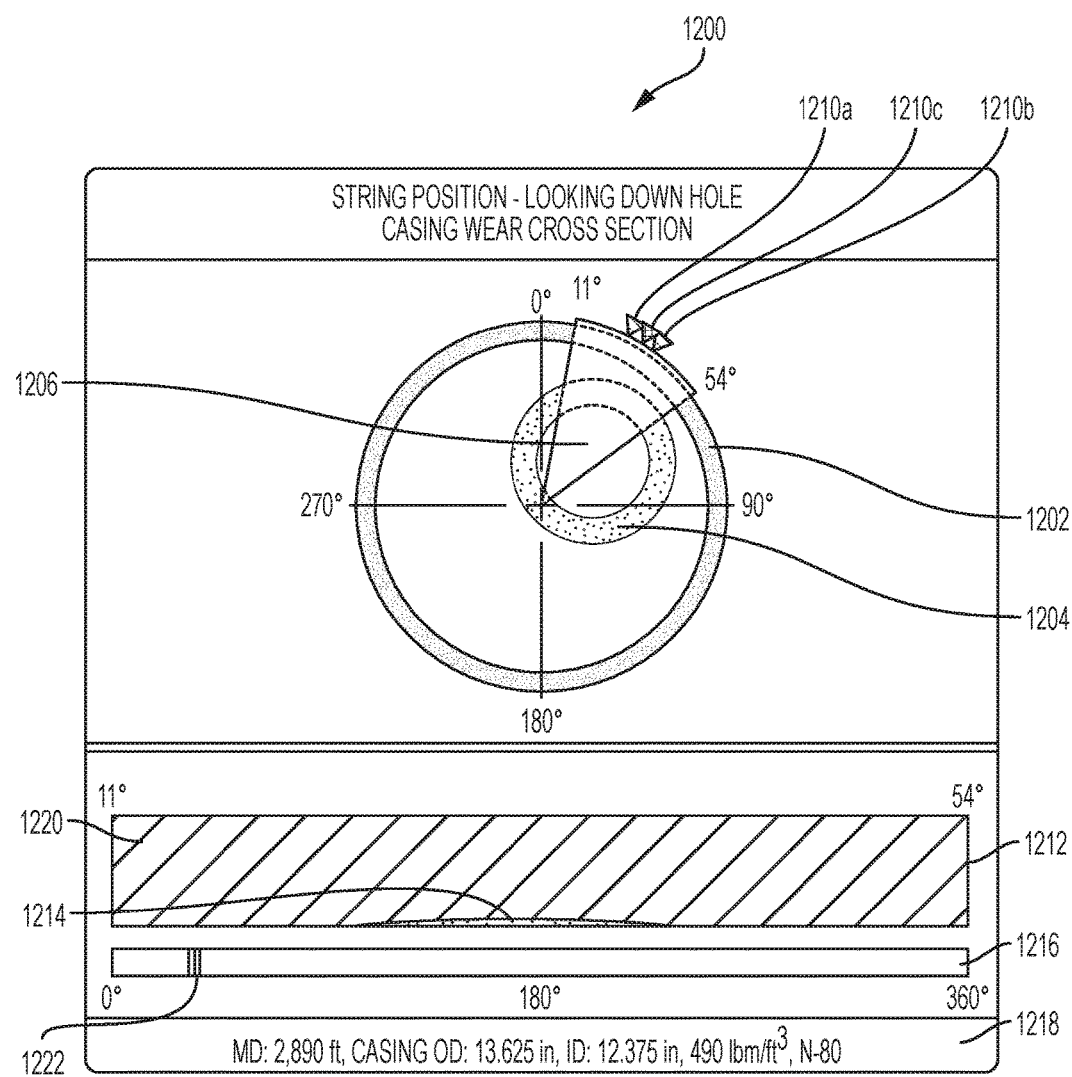
FIG. 12 is an example of a graphical user interface (GUI) showing a groove in a casing string according to some aspects.

FIG. 12 is an example of a GUI 1200 showing a groove 1214 in a casing string 1202 according to some aspects. The GUI 1200 can include a graphical representation of the cross section of a casing string 1202. The casing string 1202 can have an outer diameter and an inner diameter as indicated in the information section 1218 (e.g., an outer diameter of 13.625 inches and an inner diameter of 12.375 inches). The casing string 1202 can be positioned at a depth in a wellbore as indicated in the information section 1218 (e.g., 2,890 ft). The GUI 1200 can also include a graphical representation of the cross section of a well tool 1204 positioned within the casing string 1202.

Figure 13:
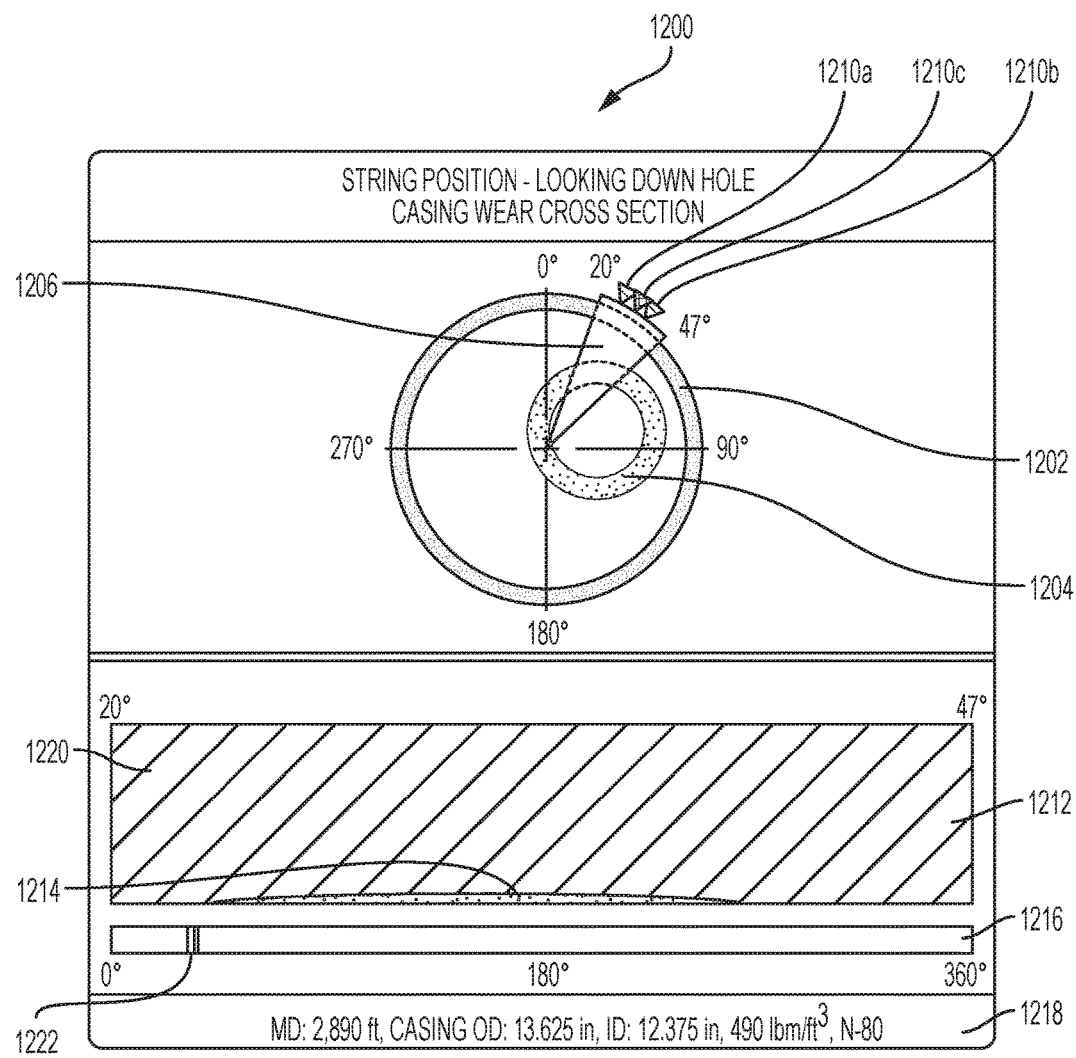
FIG. 13 is an example of the GUI of FIG. 12 showing a magnified version of the groove in the casing string according to some aspects.

In some examples, the GUI 1200 can include a pie-shaped section 1206 indicating an area of interest in the cross section of the casing string 1202. The GUI 1200 can enable a user to manipulate the pie-shaped section 1206 to change the area of interest as desired. For example, the GUI 1200 can enable the user to rotate the pie-shaped section 1206 clockwise or counterclockwise around the cross section of the casing string 1202 to view information related to other portions of the casing string 1202. In one example, the user can select the pie-shaped section 1206 (e.g., using a cursor, touch pad, or touch-screen display) and drag the pie-shaped section 1206 in a clockwise or counterclockwise direction around the cross section of the casing string 1202. In another example, the user can select an object 1222 in a bar 1216 in the GUI 1200 and drag the object 1222 in one direction (e.g., toward the 360° mark) to rotate the pie-shaped section 1206 in a clockwise direction and drag the object 1222 in an opposite direction (e.g., toward the 0° mark) to rotate the pie-shaped section 1206 in a counterclockwise direction. The GUI 1200 can additionally or alternatively enable the user to change the coverage area of the pie-shaped section 1206 (e.g., from between 11° and 54° to a larger or smaller area, such as between 27° and 47° as shown in FIG. 13).

In some examples, the GUI 1200 can include a casing-opened section 1212. The casing-opened section 1212 can show a top down, magnified view of the portion of the casing string 1202 covered by the pie-shaped section 1206. For example, the casing-opened section 1212 can show a top down, magnified view of the region of the casing string 1202 between 11° and 54°. The casing-opened section 1212 can include a rectangular shape 1220. The height of the rectangular shape 1220 can indicate the thickness of the casing string 1202 in the portion covered by the pie-shaped section 1206. The casing-opened section 1212 can also include a graphical representation of the damage 1214 (e.g., wear, a groove, etc.) to the casing string 1202.

In some examples, the GUI 1200 can maintain the proportionality between the height of the rectangular shape 1220 and depth of the damage 1214. This can enable a user to easily determine the depth of the damage 1214 to the casing string 1202 and the seriousness of the damage 1214. The GUI 1200 can also maintain the proportionality between the width of rectangular shape 1220 and the width of the damage 1214. For example, as the coverage area of the pie-shaped section 1206 is reduced or enlarged, the GUI 1200 can proportionally increase or decrease, respectively, the width of the damage 1214. A particular example is shown in FIG. 13, in which the coverage area of the pie-shaped section 1206 has been reduced to cover the area between 27° and 47°, and the casing-opened section 1212 has been magnified (e.g., zoomed in on) proportionally.

In some examples, the GUI 1200 can include indicators 1210a-c that indicate locations of damage to the casing string 1202 within the pie-shaped section 1206. The indicators 1210a-c can have different graphical characteristics (e.g., shapes, colors, sizes, etc.) that indicate different characteristics of the damage. For example, the indicator 1210c can have a color that indicates that an associated groove penetrates the casing string 1202 deeper than grooves at other locations corresponding to the other indicators 1210a-b.

In some examples in which there are multiple locations of damage within the pie-shaped section 1206, the GUI 1200 can display information associated with some or all of the damage in the rectangular shape 1220. For example, the GUI 1200 may only display the groove that penetrates the deepest into the casing string 1202 in the rectangular shape 1220, and not other grooves. Alternatively, the GUI 1200 can display all of the grooves in the rectangular shape 1220.

In some aspects, damage to a casing string in a wellbore can be determined according to one or more of the following examples:

Example #1

A system can include a processing device and a memory device on which instructions are stored for causing the processing device to use a stiff string model (or a finite state method) to predict damage to a casing string resulting from a wellbore operation. The instructions can cause the processing device to determine a contact point between the casing string and a well tool positionable within the casing string for performing the wellbore operation. The instructions can cause the processing device to determine a force of the well tool against the casing string at the contact point. The instructions can cause the processing device to determine, based on the force and the wellbore operation, a volume of damage to the casing string proximate to the contact point. The instructions can cause the processing device to determine, based on the volume of damage, a depth of a groove formed in the casing string proximate to the contact point.

Example #2

The system of Example #1 may feature the memory device further including instructions for causing the processing device to determine the contact point. The instructions can cause the processing device to determine, using the stiff string model (or the finite element method), a movement of the well tool within the casing string for performing the wellbore operation. The instructions can cause the processing device to determine, based on the movement, a position of the well tool in a cross-section of the casing string. The instructions can cause the processing device to determine, based on the position of the well tool, that an outer diameter of the well tool is contacting an inner diameter of the casing string at the contact point.

Example #3

The system of Example #2 may feature the memory device further including instructions for causing the processing device to determine the volume of damage based on the movement of the well tool in the casing string. The instructions can cause the processing device to divide the cross-section of the casing string into a plurality of slices.

The instructions can cause the processing device to associate the volume of damage with a particular slice that includes the contact point.

Example #4

The system of Example #3 may feature the memory device further including instructions for causing the processing device to associate the groove with the particular slice of the plurality of slices based on the particular slice being associated with the volume of damage. The instructions can cause the processing device to determine a width of the groove based on the volume of damage associated with the particular slice of the plurality of slices. The instructions can cause the processing device to determine the depth of the groove based on the width of the groove.

Example #5

The system of any of Examples #1-4 may feature the memory device further including instructions for causing the processing device to determine a second volume of damage, resulting from a subsequent wellbore operation, proximate to a second contact point between the well tool and the casing string. The instructions can cause the processing device to determine a combined distribution of damage by combining the volume of damage with the second volume of damage. The instructions can cause the processing device to determine a second depth of a second groove resulting from the subsequent wellbore operation. The instructions can cause the processing device to determine a combined distribution of grooves by combining the depth and location of the groove with the second depth and a second location of the second groove.

Example #6

The system of any of Examples #1-5 may feature the memory device further including instructions for causing the processing device to cause a graphical user interface to be displayed on a display device. The graphical user interface can include a cross-sectional view of the casing string. The graphical user interface can include a pie-shaped object spanning a portion of the cross-sectional view of the casing string and indicating an area of interest. The graphical user interface can include a virtual object indicating a location of the groove within the area of interest. The graphical user interface can include an illustration depicting the depth of the groove proportionally to a thickness of the casing string within the area of interest.

Example #7

The system of Example #6 may feature the memory device further including instructions for causing the processing device to cause another virtual object to be displayed within the graphical user interface. The other virtual object can indicate another location of another groove within the area of interest and have a visual characteristic indicating that the other groove has a different depth than the groove.

Example #8

A method can include determining, by a processing device and using a stiff string model (or a finite element method), a contact point between a casing string and a well tool positioned within the casing string. The contact point can result from the well tool performing a wellbore operation within the casing string. The method can include determining, by the processing device and using the stiff string model (or the finite element method), a force of the well tool against the casing string at the contact point. The method can include determining, by the processing device and based on the force and the wellbore operation, a volume of damage to the casing string proximate to the contact point. The method can include determining, by the processing device and based on the volume of damage, a depth of a groove formed in the casing string proximate to the contact point.

Example #9

The method of Example #8 may feature determining the contact point by determining, using the stiff string model (or the finite element method), a movement of the well tool within the casing string for performing the wellbore operation. The method may feature determining, based on the movement, a position of the well tool in a cross-section of the casing string. The method may feature determining, based on the position of the well tool, that an outer diameter of the well tool is contacting an inner diameter of the casing string at the contact point.

Example #10

The method of Example #9 may feature determining the volume of damage based on the movement of the well tool in the casing string. The method may feature dividing the cross-section of the casing string into a plurality of slices. The method may feature associating the volume of damage with a particular slice that includes the contact point.

Example #11

The method of Example #10 may feature associating the groove with the particular slice of the plurality of slices based on the particular slice being associated with the volume of damage. The method may feature determining a width of the groove based on the volume of damage associated with the particular slice of the plurality of slices. The method may feature determining the depth of the groove based on the width of the groove.

Example #12

The method of any of Examples #8-11 may feature determining a second volume of damage, resulting from a subsequent wellbore operation, proximate to a second contact point between the well tool and the casing string. The method may feature determining a combined distribution of damage by combining the volume of damage with the second volume of damage. The method may feature determining a second depth of a second groove resulting from the subsequent wellbore operation. The method may feature determining a combined distribution of grooves by combining the depth and location of the groove with the second depth and a second location of the second groove.

Example #13

The method of any of Examples #8-12 may feature causing a graphical user interface to be displayed on a display device. The graphical user interface can include a cross-sectional view of the casing string. The graphical user interface can include a pie-shaped object spanning a portion of the cross-sectional view of the casing string and indicating an area of interest. The graphical user interface can include a virtual object indicating a location of the groove within the area of interest. The graphical user interface can include an illustration depicting the depth of the groove proportionally to a thickness of the casing string within the area of interest.

Example #14

The method of Example #13 may feature causing another virtual object to be displayed within the graphical user interface. The other virtual object can indicate another location of another groove within the area of interest and have a visual characteristic indicating that the other groove has a different depth than the groove.

Example #15

A non-transitory computer-readable medium in which instructions executable by a processing device are stored for causing the processing device to use a stiff string model (or a finite element method) to predict damage to a casing string resulting from a wellbore operation. The instructions can cause the processing device to determine a contact point between the casing string and a well tool positionable within the casing string for performing the wellbore operation. The instructions can cause the processing device to determine a force of the well tool against the casing string at the contact point. The instructions can cause the processing device to determine, based on the force and the wellbore operation, a volume of damage to the casing string proximate to the contact point. The instructions can cause the processing device to determine, based on the volume of damage, a depth of a groove formed in the casing string proximate to the contact point.

Example #16

The non-transitory computer-readable medium of Example #15 may further feature instructions executable by the processing device for causing the processing device to determine the contact point. The instructions can cause the processing device to determine, using the stiff string model (or the finite element method), a movement of the well tool within the casing string for performing the wellbore operation. The instructions can cause the processing device to determine, based on the movement, a position of the well tool in a cross-section of the casing string. The instructions can cause the processing device to determine, based on the position of the well tool, that an outer diameter of the well tool is contacting an inner diameter of the casing string at the contact point.

Example #17

The non-transitory computer-readable medium of Example #16 may further feature instructions executable by the processing device for causing the processing device to determine the volume of damage based on the movement of the well tool in the casing string. The instructions can cause the processing device to divide the cross-section of the casing string into a plurality of slices. The instructions can cause the processing device to associate the volume of damage with a particular slice that includes the contact point.

Example #18

The non-transitory computer-readable medium of Example #17 may further feature instructions executable by the processing device for causing the processing device to associate the groove with the particular slice of the plurality of slices based on the particular slice being associated with the volume of damage. The instructions can cause the processing device to determine a width of the groove based on the volume of damage associated with the particular slice of the plurality of slices. The instructions can cause the processing device to determine the depth of the groove based on the width of the groove.

Example #19

The non-transitory computer-readable medium of any of Examples #15-18 may further feature instructions executable by the processing device for causing the processing device to determine a second volume of damage, resulting from a subsequent wellbore operation, proximate to a second contact point between the well tool and the casing string. The instructions can cause the processing device to determine a combined distribution of damage by combining the volume of damage with the second volume of damage. The instructions can cause the processing device to_. The instructions can cause the processing device to determine a second depth of a second groove resulting from the subsequent wellbore operation. The instructions can cause the processing device to determine a combined distribution of grooves by combining the depth and location of the groove with the second depth and a second location of the second groove.

Example #20

The non-transitory computer-readable medium of any of Examples #15-19 may further feature instructions executable by the processing device for causing the processing device to cause a graphical user interface to be displayed on a display device. The graphical user interface can include a cross-sectional view of the casing string. The graphical user interface can include a pie-shaped object spanning a portion of the cross-sectional view of the casing string and indicating an area of interest. The graphical user interface can include a virtual object indicating a location of the groove within the area of interest. The graphical user interface can include an illustration depicting the depth of the groove proportionally to a thickness of the casing string within the area of interest. In some examples, the graphical user interface can include another virtual object that can indicate another location of another groove within the area of interest. The other virtual object can have a visual characteristic indicating that the other groove has a different depth than the groove.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

The invention claimed is:

1. A system comprising:
a processing device; and
a memory device including instructions that are executable by the processing device for causing the processing device to:
determine, using a stiff string model, a contact point between a casing string and a well tool positionable within the casing string for performing a wellbore operation;
determine, using the stiff string model, a force of the well tool against the casing string at the contact point;
determine, based on the force and the wellbore operation, a volume of damage to the casing string proximate to the contact point; and
determine, based on the volume of damage, a first depth of a first groove formed in the casing string proximate to the contact point; and
cause a graphical user interface to be output on a display device, wherein the graphical user interface comprises:
a virtual representation of the casing string;
a first virtual object positioned proximate to the virtual representation of the casing string to indicate a first location of the first groove within an area of interest;
a virtual indicator of the first depth of the first groove; and
a second virtual object indicating a second location of a second groove within the area of interest, the second virtual object having a visual characteristic indicating that the second groove has a second depth that is different than the first depth.

2. The system of claim 1, wherein the memory device further includes instructions for causing the processing device to determine the contact point by:
determining, using the stiff string model, a movement of the well tool within the casing string for performing the wellbore operation;
determining, based on the movement, a position of the well tool in a cross-section of the casing string; and
determining, based on the position of the well tool, that an outer diameter of the well tool is contacting an inner diameter of the casing string at the contact point.

3. The system of claim 2, wherein the memory device further includes instructions for causing the processing device to:
determine the volume of damage based on the movement of the well tool in the casing string;
divide the cross-section of the casing string into a plurality of slices; and
associate the volume of damage with a particular slice that includes the contact point.

4. The system of claim 3, wherein the memory device further includes instructions for causing the processing device to:
associate the first groove with the particular slice of the plurality of slices based on the particular slice being associated with the volume of damage;
determine a width of the first groove based on the volume of damage associated with the particular slice of the plurality of slices; and
determine the first depth of the first groove based on the width of the first groove.

5. The system of claim 1, wherein memory device further includes instructions for causing the processing device to:
determine a second volume of damage, resulting from a subsequent wellbore operation, proximate to a second contact point between the well tool and the casing string;
determine a combined distribution of damage by combining the volume of damage with the second volume of damage;
determine the second depth of the second groove resulting from the subsequent wellbore operation; and
determine a combined distribution of grooves by combining the first depth and the first location of the first groove with the second depth and the second location of the second groove.

6. The system of claim 1, wherein:
the virtual representation of the casing string is a cross-sectional view of the casing string;
the first virtual object indicates the first location of the first groove within the area of interest in the cross-sectional view; and
the virtual indicator depicts the first depth of the first groove in relation to a thickness of the casing string within the area of interest.

7. The system of claim 1, wherein the graphical user interface further comprises a pie shaped object spanning a portion of the virtual representation of the casing string and indicating the area of interest.

8. A method comprising:
determining, by a processing device and using a stiff string model, a contact point between a casing string and a well tool positioned within the casing string resulting from the well tool performing a wellbore operation within the casing string;
determining, by the processing device and using the stiff string model, a force of the well tool against the casing string at the contact point;
determining, by the processing device and based on the force and the wellbore operation, a volume of damage to the casing string proximate to the contact point;
determining, by the processing device and based on the volume of damage, a first depth of a first groove formed in the casing string proximate to the contact point; and
outputting, by the processing device, a graphical user interface on a display device, wherein the graphical user interface comprises:
a virtual representation of the casing string;
a first virtual object positioned proximate to the virtual representation of the casing string to indicate a first location of the first groove within an area of interest;
a virtual indicator of the first depth of the first groove; and
a second virtual object indicating a second location of a second groove within the area of interest, the second virtual object having a visual characteristic indicating that the second groove has a second depth that is different than the first depth.

9. The method of claim 8, further comprising determining the contact point by:
determining, using the stiff string model, a movement of the well tool within the casing string for performing the wellbore operation;
determining, based on the movement, a position of the well tool in a cross-section of the casing string; and
determining, based on the position of the well tool, that an outer diameter of the well tool is contacting an inner diameter of the casing string at the contact point.

10. The method of claim 9, further comprising:
determining the volume of damage based on the movement of the well tool in the casing string;
dividing the cross-section of the casing string into a plurality of slices; and
associating the volume of damage with a particular slice that includes the contact point.

11. The method of claim 10, further comprising:
associating the first groove with the particular slice of the plurality of slices based on the particular slice being associated with the volume of damage;
determining a width of the first groove based on the volume of damage associated with the particular slice of the plurality of slices; and
determining the first depth of the first groove based on the width of the first groove.

12. The method of claim 8, further comprising:
determining a second volume of damage, resulting from a subsequent wellbore operation, proximate to a second contact point between the well tool and the casing string;
determining a combined distribution of damage by combining the volume of damage with the second volume of damage;
determining the second depth of the second groove resulting from the subsequent wellbore operation; and
determining a combined distribution of grooves by combining the first depth and the first location of the first groove with the second depth and the second location of the second groove.

13. The method of claim 8, wherein:
the virtual representation of the casing string is a cross-sectional view of the casing string;
the first virtual object indicates the first location of the first groove within the area of interest in the cross-sectional view; and
the virtual indicator depicts the first depth of the first groove in relation to a thickness of the casing string within the area of interest.

14. A non-transitory computer-readable medium in which instructions executable by a processing device are stored for causing the processing device to:
use a stiff string model to predict damage to a casing string resulting from a wellbore operation by:
determining a contact point between the casing string and a well tool positionable within the casing string for performing the wellbore operation;
determining a force of the well tool against the casing string at the contact point;
determining, based on the force and the wellbore operation, a volume of damage to the casing string proximate to the contact point; and
determining, based on the volume of damage, a first depth of a first groove formed in the casing string proximate to the contact point; and
cause a graphical user interface to be output on a display device, wherein the graphical user interface comprises:
a virtual representation of the casing string;
a first virtual object positioned proximate to the virtual representation of the casing string to indicate a first location of the first groove within an area of interest;
a virtual indicator of the first depth of the first groove; and
a second virtual object indicating a second location of a second groove within the area of interest, the second virtual object having a visual characteristic indicating that the second groove has a second depth that is different than the first depth.

15. The non-transitory computer-readable medium of claim 14, further comprising instructions executable by the processing device for causing the processing device to determine the contact point by:
determining, using the stiff string model, a movement of the well tool within the casing string for performing the wellbore operation;
determining, based on the movement, a position of the well tool in a cross-section of the casing string; and
determining, based on the position of the well tool, that an outer diameter of the well tool is contacting an inner diameter of the casing string at the contact point.

16. The non-transitory computer-readable medium of claim 15, further comprising instructions executable by the processing device for causing the processing device to:
determine the volume of damage based on the movement of the well tool in the casing string;
divide the cross-section of the casing string into a plurality of slices; and
associate the volume of damage with a particular slice that includes the contact point.

17. The non-transitory computer-readable medium of claim 16, further comprising instructions executable by the processing device for causing the processing device to:
associate the first groove with the particular slice of the plurality of slices based on the particular slice being associated with the volume of damage;
determine a width of the first groove based on the volume of damage associated with the particular slice of the plurality of slices; and
determine the first depth of the first groove based on the width of the first groove.

18. The non-transitory computer-readable medium of claim 14, further comprising instructions executable by the processing device for causing the processing device to:
determine a second volume of damage, resulting from a subsequent wellbore operation, proximate to a second contact point between the well tool and the casing string;
determine a combined distribution of damage by combining the volume of damage with the second volume of damage;
determine the second depth of the second groove resulting from the subsequent wellbore operation; and
determine a combined distribution of grooves by combining the first depth and the first location of the first groove with the second depth and the second location of the second groove.

19. The non-transitory computer-readable medium of claim 14, wherein:
the virtual representation of the casing string is a cross-sectional view of the casing string;
the first virtual object indicates the first location of the first groove within the area of interest in the cross-sectional view; and
the virtual indicator depicts the first depth of the first groove proportionally to a thickness of the casing string within the area of interest.

20. A non-transitory computer-readable medium in which instructions executable by a processing device are stored for causing the processing device to:
determine, using a stiff string model, a movement of a well tool within a casing string for performing a wellbore operation;

determine, using the stiff string model, a contact point between the casing string and the well tool based on the movement;
determine, using the stiff string model, a force of the well tool against the casing string at the contact point;
determine, based on the force, a volume of damage to the casing string proximate to the contact point;
determine, based on the volume of damage, a depth of a groove formed in the casing string proximate to the contact point;
determine a position of the well tool in a cross-section of the casing string based on the movement;
divide the cross-section of the casing string into a plurality of slices; and
associate the volume of damage with a particular slice that includes the contact point.

21. The non-transitory computer-readable medium of claim 20, further comprising instructions executable by the processing device for causing the processing device to:
determine, based on the position of the well tool, that an outer diameter of the well tool is contacting an inner diameter of the casing string at the contact point.

22. The non-transitory computer-readable medium of claim 20, further comprising instructions executable by the processing device for causing the processing device to:
associate the groove with the particular slice of the plurality of slices based on the particular slice being associated with the volume of damage;
determine a width of the groove based on the volume of damage associated with the particular slice of the plurality of slices; and
determine the depth of the groove based on the width of the groove.

23. The non-transitory computer-readable medium of claim 20, further comprising instructions executable by the processing device for causing the processing device to:
determine a second volume of damage, resulting from a subsequent wellbore operation, proximate to a second contact point between the well tool and the casing string;
determine a combined distribution of damage by combining the volume of damage with the second volume of damage;
determine a second depth of a second groove resulting from the subsequent wellbore operation; and
determine a combined distribution of grooves by combining the depth and location of the groove with the second depth and a second location of the second groove.

* * * * *